(12) United States Patent
Strehlow et al.

(10) Patent No.: US 11,119,115 B2
(45) Date of Patent: Sep. 14, 2021

(54) VIBRATING BEAM ACCELEROMETER

(71) Applicant: Honeywell International Inc., Morris Plains, NJ (US)

(72) Inventors: John Strehlow, Mukilteo, WA (US); Mitchell Novack, Kenmore, WA (US)

(73) Assignee: Honeywell International Inc., Charlotte, NC (US)

(*) Notice: Subject to any disclaimer, the term of this patent is extended or adjusted under 35 U.S.C. 154(b) by 160 days.

(21) Appl. No.: 16/113,949

(22) Filed: Aug. 27, 2018

(65) Prior Publication Data
US 2020/0064367 A1 Feb. 27, 2020

(51) Int. Cl.
*G01P 15/097* (2006.01)
*H03H 9/02* (2006.01)
*H03H 9/24* (2006.01)

(52) U.S. Cl.
CPC ....... *G01P 15/097* (2013.01); *H03H 9/02259* (2013.01); *H03H 9/02433* (2013.01); *H03H 9/2473* (2013.01); *H03H 2009/0248* (2013.01); *H03H 2009/02291* (2013.01)

(58) Field of Classification Search
CPC .......... G01P 15/097; G01P 2015/0822; G01P 2015/0825; G01P 2015/0857; G01P 15/13; G01P 15/125; H03H 9/02259; H03H 9/02433; H03H 9/2473; H03H 2009/02291; H03H 2009/0248; H03H 2009/02283; H03H 2009/02299
USPC .............. 73/514.29, 504.02–504.04, 504.15, 73/504.16, 514.32–514.35
See application file for complete search history.

(56) References Cited

U.S. PATENT DOCUMENTS

| | | |
|---|---|---|
| 3,470,400 A | 9/1969 | Weisbord |
| 4,215,570 A | 8/1980 | Eer Nisse |
| 4,321,500 A | 3/1982 | Paros et al. |
| 4,469,979 A | 9/1984 | Chuang |
| 4,724,351 A | 2/1988 | EerNisse et al. |
| 4,757,228 A | 7/1988 | Kalinoski et al. |
| 4,773,493 A | 9/1988 | Goodier |
| 4,785,215 A | 11/1988 | Blech |

(Continued)

FOREIGN PATENT DOCUMENTS

EP 2105747 A2 9/2009

OTHER PUBLICATIONS

Extended Search Report from counterpart European Application No. 19181404.5, dated Jan. 8, 2020, 8 pp.

(Continued)

*Primary Examiner* — Robert R Raevis
(74) *Attorney, Agent, or Firm* — Shumaker & Sieffert, P.A.

(57) ABSTRACT

A resonator defining a longitudinal axis that includes a mounting pad, a pad connector, at least one isolation mechanism, and a pair of elongated tines extending in the direction of the longitudinal axis. The isolation mechanism including an outer block defining a first outer end and a second outer end on opposite sides, an inner block defining a first inner end and a second inner end on opposite sides, and a pair of interconnect members, where each respective interconnect member of the pair of interconnect members connects the second outer end to the first inner end. The respective first ends of the pair of elongated tines being connected to the second inner end and the pad connector connects the mounting pad to the first outer end.

20 Claims, 5 Drawing Sheets

(56) References Cited

U.S. PATENT DOCUMENTS

| | | | |
|---|---|---|---|
| 4,980,598 A | 12/1990 | Albert | |
| 5,331,242 A | 7/1994 | Petri | |
| 5,367,217 A | 11/1994 | Norling | |
| 5,501,103 A | 3/1996 | Woodruff et al. | |
| 6,073,484 A * | 6/2000 | Miller | G01B 5/28 |
| | | | 73/105 |
| 6,269,698 B1 * | 8/2001 | Woodruff | G01P 15/097 |
| | | | 73/514.29 |
| 6,553,834 B2 | 4/2003 | Blake | |
| 6,826,960 B2 | 12/2004 | Schaad et al. | |
| 6,874,363 B1 | 4/2005 | Foote et al. | |
| 7,498,728 B2 | 3/2009 | Albert | |
| 8,887,567 B2 | 11/2014 | Dwyer et al. | |
| 8,955,382 B2 | 2/2015 | Dwyer et al. | |
| 9,759,739 B2 | 9/2017 | Strehlow et al. | |
| 2002/0050167 A1 * | 5/2002 | Foote | F16F 15/02 |
| | | | 73/493 |
| 2004/0016307 A1 * | 1/2004 | Albert | G01L 1/106 |
| | | | 73/862.627 |
| 2004/0187578 A1 * | 9/2004 | Malametz | B81B 3/0072 |
| | | | 73/514.36 |
| 2006/0201249 A1 | 9/2006 | Horning et al. | |
| 2008/0087083 A1 | 4/2008 | Nishizawa et al. | |
| 2010/0067208 A1 * | 3/2010 | Inoue | G01C 19/5719 |
| | | | 361/803 |
| 2013/0112019 A1 | 5/2013 | Watanabe | |

OTHER PUBLICATIONS

Zhang, et al. "Microelectromechanical Resonant Accelerometer Designed with a High Sensitivity," Sensors, Oct. 11, 2015, 18 pp.

U.S. Appl. No. 16/041,244, by Honeywell International Inc. (Inventor: John Reinke) filed Jul. 20, 2018.

U.S. Appl. No. 16/041,187, by Honeywell International Inc. (Inventor: John Reinke) filed Jul. 20, 2018.

Response to Extended Search Report from counterpart European Application No. 19181404.5, dated Jan. 8, 2020, filed Aug. 19, 2020, 14 pp.

* cited by examiner

VIBRATING BEAM ACCELEROMETER

STATEMENT REGARDING FEDERALLY SPONSORED RESEARCH OR DEVELOPMENT

This invention was made with Government support under Government Contract Number HR0011-16-9-0001 awarded by DARPA. The Government has certain rights in the invention.

TECHNICAL FIELD

The present disclosure relates to vibrating beam accelerometers, also referred to as resonating beam accelerometers.

BACKGROUND

Accelerometers function by detecting the displacement of a proof mass under inertial forces. One technique of detecting the force and acceleration is to measure the displacement of the mass relative to a frame. Another technique is to measure the strain induced in resonators attached a proof mass as they counteract inertial forces of the proof mass. The strain may, for example, be determined by measuring the change in the frequencies of the resonators as the accelerometer is subjected to an outside force.

SUMMARY

In some examples, the disclosure describes vibrating beam accelerometers (VBAs) in which the resonator has segmented isolation blocks between the mounting pads and resonating tines that may reduce the axial strain or end pumping on the mounting pads from resonance of the tine, resulting in accelerometers with improved accuracy and precision and lower measurement error.

In some examples, the disclosure describes a resonator defining a longitudinal axis, the resonator including a mounting pad; a pad connector; an isolation mechanism including an outer block defining a first outer end and a second outer end on opposite sides, an inner block defining a first inner end and a second inner end on opposite sides, and a pair of interconnect members, where each respective interconnect member of the pair of interconnect members connects the second outer end to the first inner end; and a pair of elongated tines extending in the direction of the longitudinal axis, where respective first ends of the pair of elongated tines are connected to the second inner end, where the pad connector connects the mounting pad to the first outer end.

In some examples, the disclosure describes a proof mass assembly including a resonator defining a longitudinal axis, a proof mass, a proof support, and at least one flexure connecting the proof mass to the proof support. The resonator including a first mounting pad, a pad connector, an isolation mechanism, and a pair of elongated tines extending in a direction of a longitudinal axis of the first resonator. The isolation mechanism including an outer block defining a first outer end and a second outer end on opposite sides, an inner block defining a first inner end and a second inner end on opposite sides, and a pair of interconnect members, where each respective interconnect member of the pair of interconnect members connects the second outer end to the first inner end. The respective first ends of the pair of elongated tines being connected to the second inner end and the pad connector connects the first mounting pad to the first outer end. The first mounting pad of the resonator being bonded to a surface of either the proof mass or a surface of the proof support.

In some examples, the disclosure describes a resonator defining a longitudinal axis, the resonator including a first and a second mounting pad, a first and a second pad connector, a first and second isolation mechanism, and a pair of elongated tines extending in the direction of the longitudinal axis. Each respective isolation mechanism includes an outer block defining a first outer end and a second outer end on opposite sides, an inner block defining a first inner end and a second inner end on opposite sides, and a pair of interconnect members, where each respective interconnect member of the pair of interconnect members connects the second outer end to the first inner end. The respective first ends of the pair of elongated tines being connected to the second inner end of the first isolation mechanism and respective second ends of the pair of elongated tines are connected to the second inner end of the second isolation mechanism, where the first pad connector connects the first mounting pad to the first outer end of the first isolation mechanism, and where the second pad connector connects the second mounting pad to the first outer end of the second isolation mechanism.

The details of one or more examples are set forth in the accompanying drawings and the description below. Other features, objects, and advantages will be apparent from the description and drawings, and from the claims.

DETAILED DESCRIPTION

Navigation, guidance, and positioning systems rely on the accuracy of accelerometers to perform critical operations in various environments. One type of accelerometer is a Precision Micro-Electro Mechanical System (MEMS) vibrating beam accelerometer (VBA) that utilizes a pair of resonators and measures to changes in vibrational frequencies between the resonators to sense the changes in orientation and/or acceleration. Such VBAs offer several advantages over conventional accelerometer designs such as lower fabrication cost, smaller size, ability to survive extreme environments, and performance stability.

To sense the change in in orientation and/or acceleration two resonators may be attached to opposite sides of a proof mass in a push-pull configuration. Each resonator may include a pair of elongated beams or tines and each resonator can vibrate a different frequencies depending on the axial strain within the respective tines. Drive and sense functions may be incorporated in features of the resonator to maintain the vibration of the elongated tines in the fundamental asymmetric mode with the differential frequencies between the two resonators representing the sensed acceleration.

Within a single resonator, the movement of the parallel elongated beams or tines may be designed to be balanced laterally (e.g., perpendicular to the longitudinal axis of the elongated tines). However, as described further below, the movement of the parallel elongated beams or tines may exert an unintended axial strain (e.g., strain in the direction parallel to the longitudinal axis of the elongated tines) on the mounting pads leading to measurement errors. In some examples, the present disclosure describes structures of resonators that include sets of isolation mechanisms, which may help reduce or eliminate the axial strain produced by the movement of the elongated beams or tines leading to improved measurement accuracy.

Figure 1A:
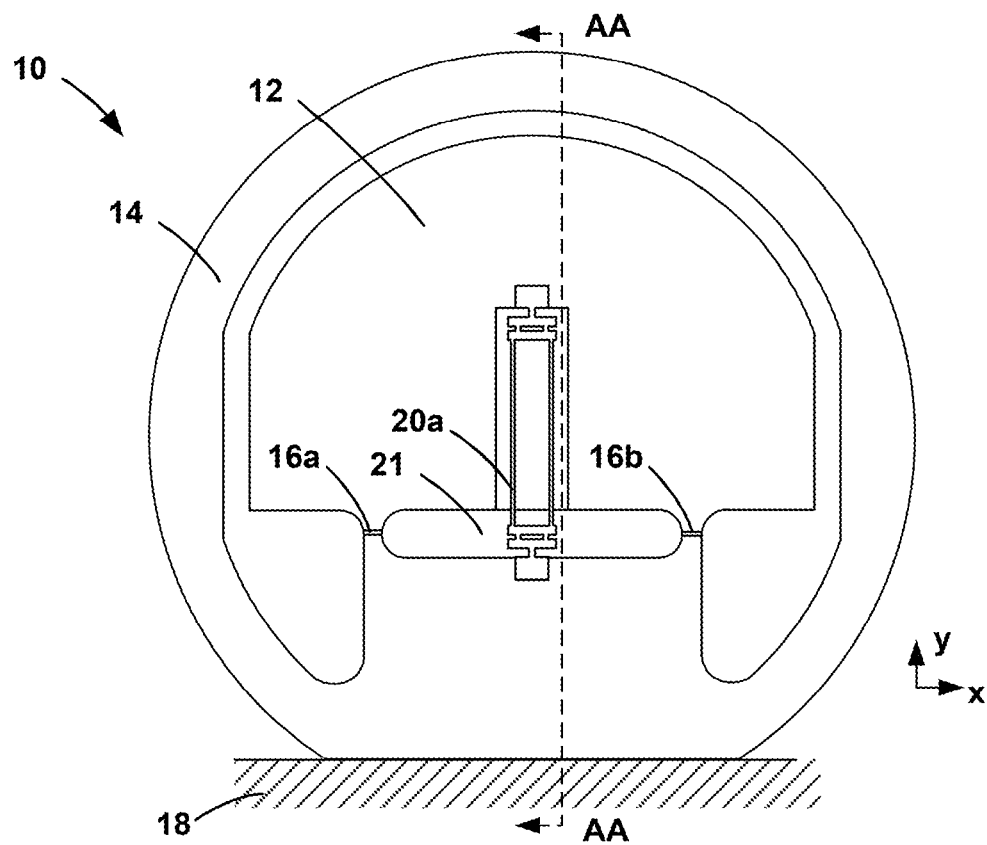
FIG. 1A is a conceptual diagram illustrating a top view of an example proof mass assembly.
Figure 1B:
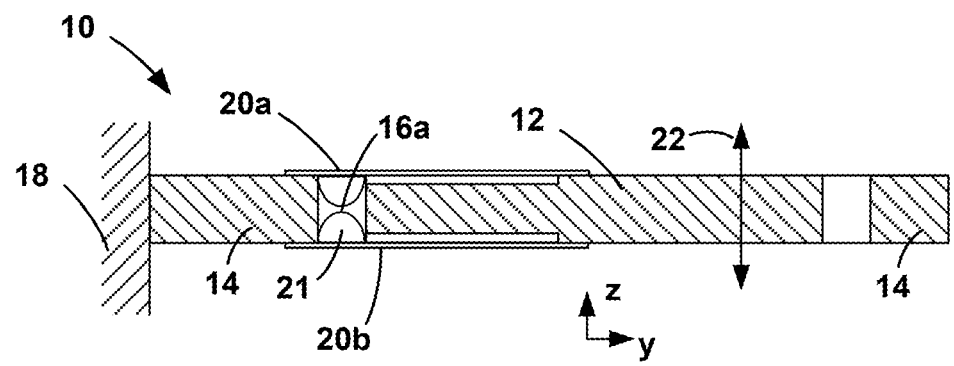
FIG. 1B is a conceptual diagram illustrating a cross-sectional side view of the example proof mass assembly of FIG. 1A along line AA-AA.

FIGS. 1A and 1B are conceptual diagrams illustrating a top view (FIG. 1A) and a cross-sectional side view (FIG. 1B, taken along line AA-AA of FIG. 1A) of an example proof mass assembly 10 that includes a proof mass 12 connected to proof support 14 by flexures 16a and 16b. Proof mass assembly 10 also includes at least two resonators 20a and 20b bridging a gap 21 between proof mass 12 and proof support 14. Resonators 20a and 20b each have opposing ends mounted to respective surfaces of proof mass 12 and proof support 14, respectively. Proof mass assembly 10 may be a proof mass assembly of a VBA. Likewise, resonators 20a and 20b may be used with a VBA or other device that incorporates resonators 20a and 20b and may benefit from the design features of resonators 20a and 20b described herein. In some examples, proof mass assembly 10 may be an out-of-plane proof mass (as shown in FIGS. 1A and 1B) or an in-plane proof mass assembly.

VBAs operate by monitoring the differential change in frequencies between resonators 20a and 20b. Each of resonators 20a and 20b, also referred to as double ended tuning forks (DETFs), will vibrate at a certain frequency depending on the axial strain (e.g., compression or tension exerted in the y-axis direction of FIGS. 1A and 1B) exerted on the respective resonator 20a or 20b. During operation, proof support 14 may be directly or indirectly mounted to an object 18 (e.g., aircraft, missile, orientation module, etc.) that undergoes an acceleration or angular change that causes proof mass 12 to experience inertial displacements in a direction perpendicular to the plane defined by flexures 16a and 16b (e.g., in the direction of arrows 22 or in the direction of the z-axis of FIG. 1B). The deflection of proof mass 12 induces axial tension on one of resonators 20a and 20b and axial compression on the other depending on the direction of the force or directional change. The different relative strains on resonators 20a and 20b with alter the respective vibration frequencies of the elongated tines of resonators 20a and 20b. By measuring these changes, the direction and magnitude of the force exerted on object 18, and thus the acceleration or orientation, can be measured.

Proof mass assembly 10 may include additional components that are used to induce an oscillating frequency across resonators 20a and 20b such as one or more electrical traces, piezoelectric drivers, electrodes, and the like, or other components that may be used with the final construction of the accelerometer such as stators, permanent magnets, capacitance pick-off plates, dampening plates, force-rebalance coils, and the like, which are not shown in FIGS. 1A and 1B. Such components are known and may be incorporated on proof mass assembly 10 or the final accelerometer (e.g., VBA) by those having ordinary skill in the art.

As shown in FIG. 1A, proof support 14 may be a planar ring structure that substantially surrounds proof mass 12 and substantially maintains flexures 16a and 16b and proof mass 12 in a common plane (e.g., the x-y plane of FIGS. 1A and 1B). Although proof support 14 as shown in FIG. 1A is a circular shape, it is contemplated that proof support 14 may be any shape (e.g., square, rectangular, oval, or the like) and may or may not surround proof mass 12.

Proof mass 12, proof support 14, resonators 20a and 20b, and flexures 16 may be formed using any suitable material. In some examples, proof mass 12, proof support 14, resonators 20a and 20b, and flexures 16 may be made of a silicon-based material, such as quartz ($SiO_2$), a piezoelectric material, Berlinite ($AlPO_4$), gallium orthophosphate ($GaPO_4$), thermaline, barium titanate ($BaTiO_3$), lead zirconate titanate (PZT), zinc oxide (ZnO), aluminum nitride (AlN), a metal alloy such as nickel-chromium alloy (e.g., Inconel), or the like. In some examples, Proof mass 12, proof support 14, resonators 20a and 20b, and flexures 16 may be formed using the same material.

Figure 2:
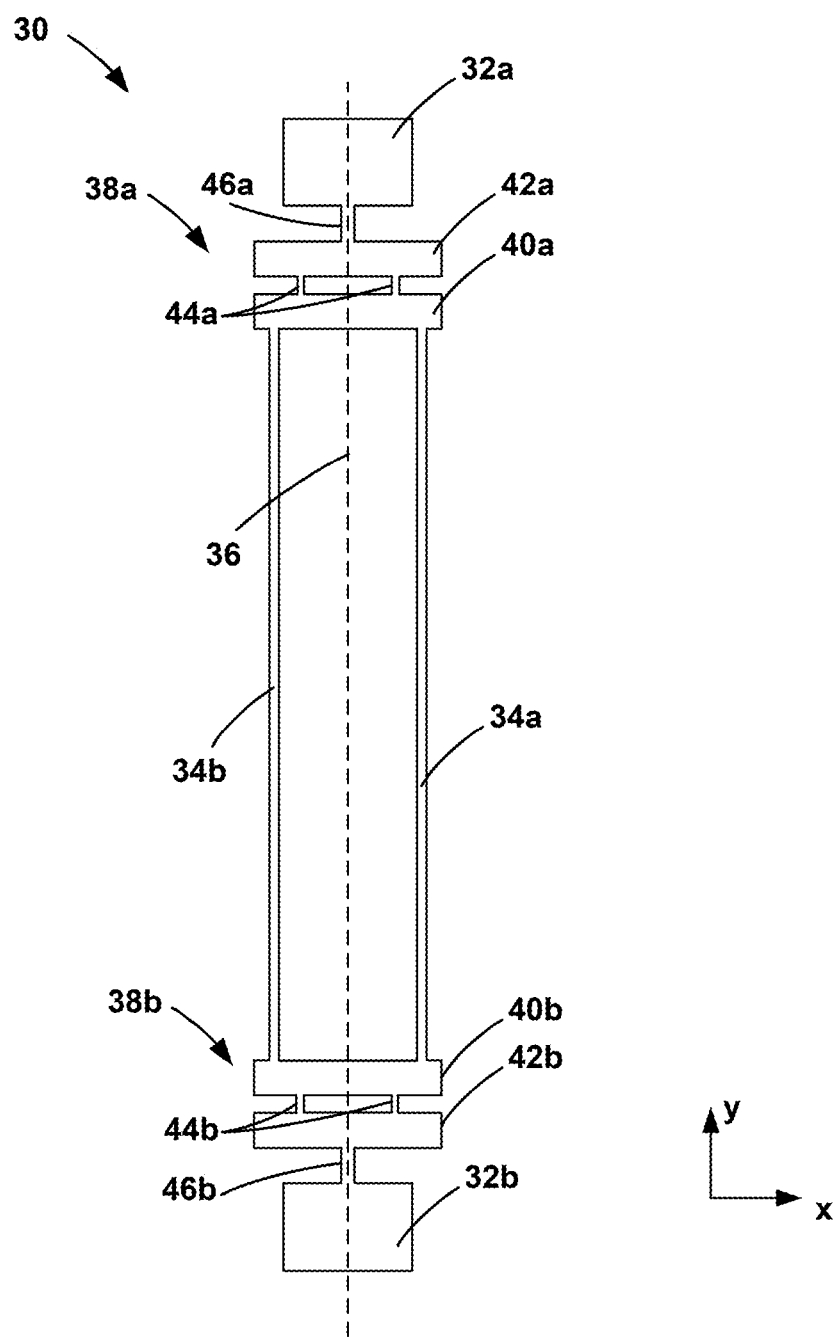
FIG. 2 is a schematic view of an example resonator that may be used with the proof mass assembly of FIG. 1A.

FIG. 2 is an enlarged schematic view of an example resonator 30 (e.g., one of resonators 20a and 20b) that includes a first and a second mounting pad 32a and 32b positioned at opposite ends of resonator 30. Resonator 30 also includes a set of vibrating elongated beams or tines (referred to herein as "elongated tines 34a and 34b") that extend parallel to each other along a longitudinal axis 36. Positioned between elongated tines 34a and 34b and the respective first and second mounting pads 32a and 32b are isolation mechanisms 38a and 38b. Each isolation mechanism 38a and 38b may include an inner block 40a and 40b and an outer block 42a and 42b. Each respective inner block 40a and 40b and outer block 42a and 42b may be connected by a pair of interconnect members 44a and 44b. Each inner block 40a and 40b directly connects to a respective end of both elongated tines 34a and 34b. Outer blocks 42a and 42b are connected to first and second mounting pads 32a and 32b by a pad connector 46a and 46b respectively. For example, in reference to isolation mechanism 38a, inner block 40a and outer block 42a are connected by pair of interconnect members 44a. Outer block 42a connects to first mounting pad 32a via pad connector 46a and inner block 40a connects to a respective first end of both elongated tines 34a and 34b. As described above, resonator 30 may be referred to as a DETF. In some examples, resonator 30 may lie within a single plane (e.g., the x-y plane as shown in FIG. 2).

First and second mounting pads 32a and 32b of resonator 30 may be secured to either a proof mass (e.g., proof mass 12 of FIG. 1A) or a proof support (e.g., proof support 14 of FIG. 1A) respectively, using any suitable technique. In some examples, first and second mounting pads 32a and 32b may be secured to a respective proof mass or proof support using a bonding adhesive such as an epoxy, using a solder, braze, or weld, or other suitable bonding mechanism. In some examples, first and second mounting pads 32a and 32b may be the only portions of resonator 30 that are mechanically coupled to the device (e.g., proof mass 12 or proof support 14) in which resonator 30 is being installed allowing the remaining portions of resonator 30 to be free floating.

Additional details regarding the geometry and arrangement of isolation mechanisms 38a and 38b are discussed in further detail below with respect to FIGS. 3 and 4. While the details below are discussed with respect to isolation mechanism 38a, such details may be equally applicable to the components and arrangement of isolation mechanism 38b. In some examples, isolation mechanisms 38a and 38b may be substantially the same (e.g., the same or nearly the same)

or may be mirror images of one another. In other examples, resonator 30 may include only one of isolation mechanisms 38a and 38b. While the details below are discussed with respect to single resonator 30, both resonators incorporated in a proof mass assembly (e.g., resonators 20a and 20b of proof mass assembly 10) may include one or more of the isolation mechanisms 38 described herein.

Figure 3:
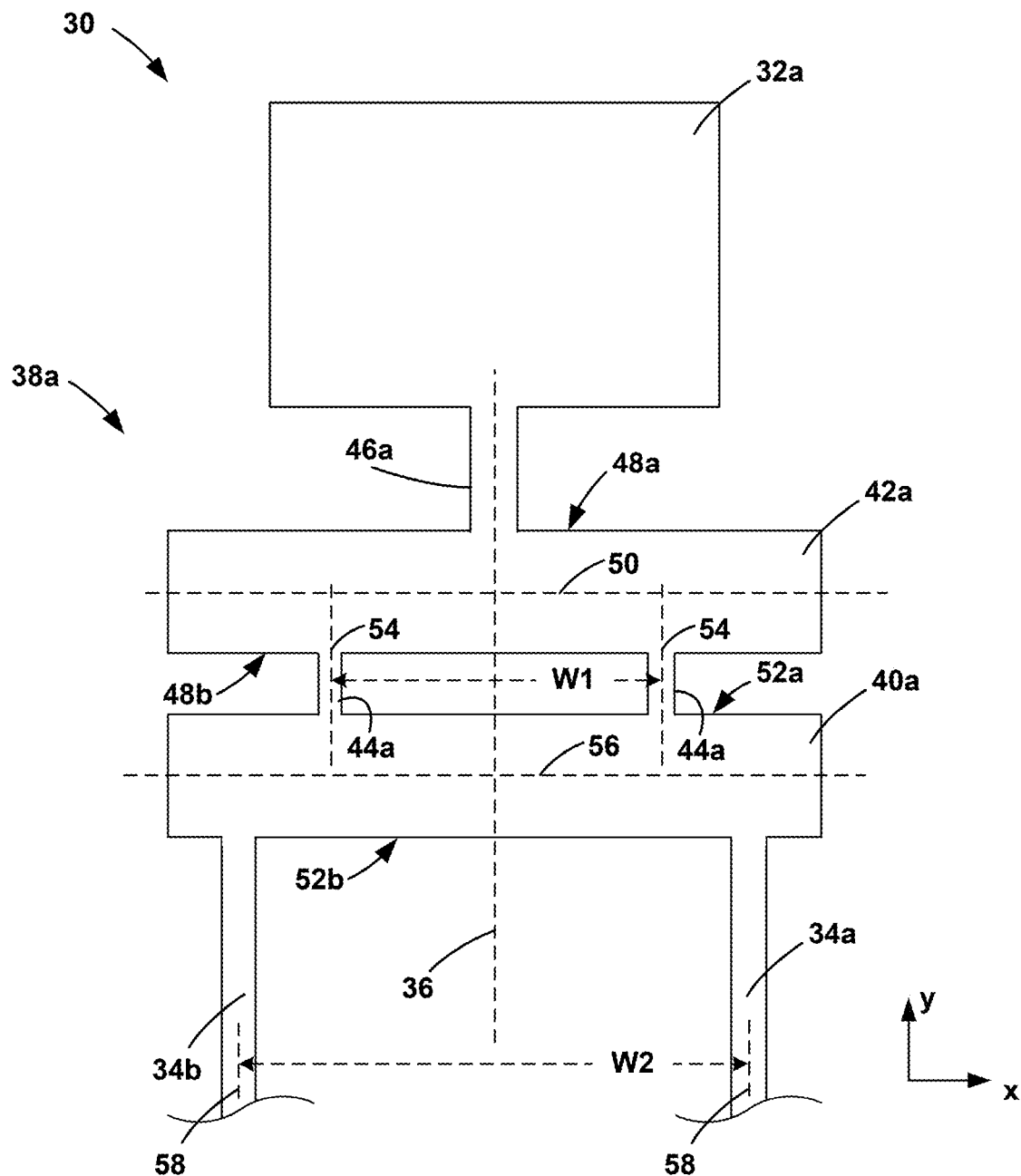
FIG. 3 is an enlarged schematic view of an example isolation mechanism of the resonator of FIG. 2 while in a resting state.
Figure 4:
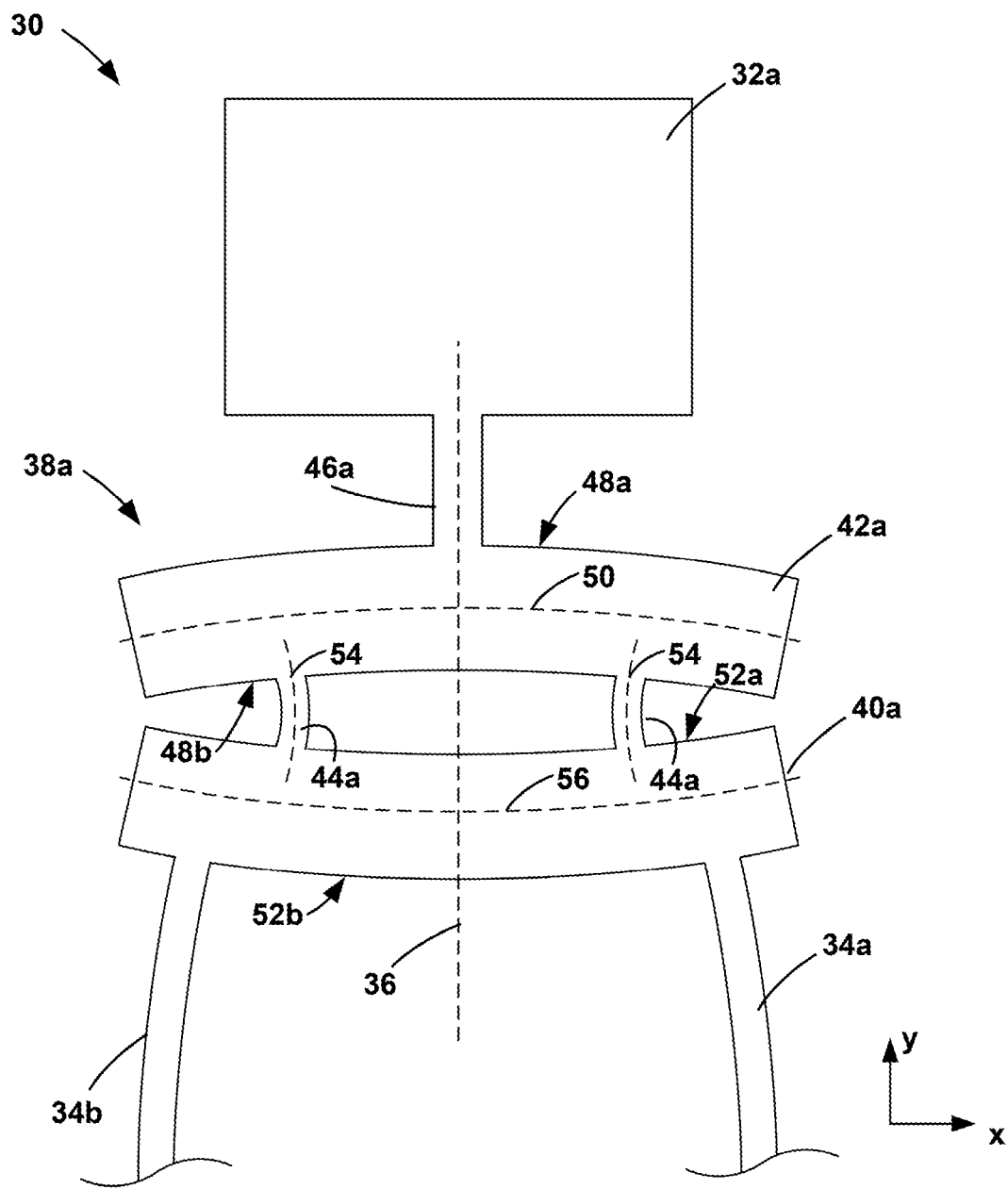
FIG. 4 is an enlarged schematic view of an example isolation mechanism of the resonator of FIG. 2 while in a resonance state.

FIG. 3 is an enlarged schematic view of isolation mechanism 38a of resonator 30 of FIG. 2 while in a resting state (e.g., non-resonating). As shown in FIG. 3, bond connector 46a connects first mounting pad 32a to a first end 48a of outer block 42a. Bond connector 46a may be an elongated, thin strip of material acting as a bridge between outer block 42a and first mounting pad 32a to isolate the two members from one another. In some examples, bond connector 46a may be the only component of resonator 30 that physically connects outer block 42a and first mounting pad 32a. It is understood that addition components associated with the drive and sense mechanism such as electrical traces may be formed along parts of isolation mechanism 38a including, for example, bond connector 46a, which are not be shown or described herein.

In some examples, bond connector 46a may be aligned and centered on longitudinal axis 36, which defines a center line between elongated tines 34a and 34b. In this manner, the lateral movement of elongated tines 34a and 34b (e.g., movement in the x-axis direction of FIG. 3) may be effectively balanced, thereby creating insignificant lateral strain on bond connector 46a during operation. The width and length (e.g., as measured in the x-axis and y-axis directions of FIG. 3 respectively) of bond connector 46a may be of any suitable size. In some examples, the relative width (e.g., the distance in the direction of the x-axis) of bond connector 46a may be greater than the relative width of a respective elongated tine 34a (e.g., the distance in the direction of the x-axis) such as on the order of about twice the width of elongated tine 34a.

Outer block 42a connects to bond connector 46a along first end 48a and connects to pair of interconnect members 44a along second end 48b. First and second ends 48a and 48b may define opposite sides of outer block 42a with first end 48a being in closer proximity to first mounting pad 32a and second end 48b being in closer proximity to elongated tines 34a and 34b. Outer block 42a may extend laterally (e.g., perpendicular to longitudinal axis 36) along outer block axis 50. Outer block axis 50 may be substantially perpendicular (e.g., perpendicular or nearly perpendicular) to longitudinal axis 36 while resonator is in a resting state. In some examples, outer block 42a may be rectangular in shape defining a width and length (e.g., as measured in the x-axis and y-axis directions of FIG. 3 respectively) of any suitable size. In some examples, the relative length of outer block 42a (e.g., as measured in the y-axis of FIG. 3) may be on the order of about ⅓ to about ½ the size of the relative width of outer block 42a (e.g., as measured in the x-axis of FIG. 3). Additionally, or alternatively, the relative length of outer block 42a may be greater than the relative width of a respective elongated tine 34a (e.g., as measured in the x-axis of FIG. 3) and less than about five times the relative width of a respective elongated tine 34a. In some examples, the relative length of outer block 42a may be between about three to about five times the width of a respective elongated tine 34a. In some examples, the width of outer block 42a (e.g., as measured in the x-axis of FIG. 3) may be longer than the outside width of interconnect members 44a (e.g., from the outside of the first interconnect member 44a to the outside of the second interconnect member 44a as measured in the x-axis direction) and about equal to or less than the widths of inner block 40a.

Pair of interconnect members 44a connect second end 48b of outer block 42a to first end 52a of inner block 40a. Each interconnect member of pair of interconnect members 44a may be an elongated, thin strip of material acting as a bridge between outer block 42a and inner block 40a to physically isolate the two blocks from one another. In some examples, pair of interconnect members 44a may be the only components of resonator 30 (e.g., excluding any additional electrical traces or other components deposited thereon) that physically connects outer block 42a and inner block 40a. In some examples, pair of interconnect members 44a may be aligned substantially parallel (e.g., parallel or nearly parallel) to longitudinal axis 36 but separated by a separation distance (e.g., the distance W1 as measured between the central axes 54 of interconnect members 44a), which bisects the center line (e.g., longitudinal axis 36) of resonator 30. In some examples, the separation distance (e.g., distance W1) between pair of interconnect members 44a may be equal to or less than the separation distance between elongated tines 34a and 34b (e.g., the distance W2 as measured between the central axes 58 of elongated tines 34a and 34b). In other examples such as where only a single isolation mechanism 38a is included with resonator 30, the separation distance (e.g., distance W1) between pair of interconnect members 44a may be equal, less than, or greater than the separation distance between elongated tines 34a and 34b (e.g., distance W2). As described further below, the ratio of W1:W2 may be selected to zero out the end-pumping that occurs as a result of the bowing of inner and outer blocks 40a and 42a.

The width and length (e.g., as measured in the x-axis and y-axis directions of FIG. 3 respectively) of each interconnect member may be of any suitable size. In some examples, the relative widths of the respective interconnect members 44a (e.g., as measured in the x-axis of FIG. 3) may be substantially equal to (e.g., equal or nearly equal) the relative width of a respective elongated tine 34a, or may be greater than (e.g., up to about twice) the relative width of a respective elongated tine 34a. The relative lengths of the respective interconnect members 44a may define the separation gap between inner and outer blocks 40a and 42b. In some examples, the relative lengths of the respective interconnect members 44a may be equal to the respective relative widths or may be greater than the respective relative widths.

Each interconnect member of pair of interconnect members 44a may define a central axis 54 that extends along its length (e.g., in the y-axis direction of FIG. 3). For reasons described further below, in some examples central axes 54 may be aligned substantially parallel (e.g., parallel or nearly parallel) and centered with the respective axes of elongated tines 34a and 34b, or central axes 54 may be aligned substantially parallel (e.g., parallel or nearly parallel) with the respective axes of elongated tines 34a and 34b but may be off-centered such that pair of interconnect members 44a are positioned closer of further to the center line (e.g., longitudinal axis 36) of resonator 30 than elongated tines 34a and 34b. FIG. 3 illustrates the latter configuration.

Inner block 40a connects to interconnect members 44a along first end 52a and connects to respective first ends of elongated tines 34a and 34b along second end 52b. First and second ends 52a and 52b may define opposite sides of inner block 40a with first end 52a being in closer proximity to first mounting pad 32a and second end 52b being in closer proximity to elongated tines 34a and 34b. Inner block 40a may extend laterally (e.g., perpendicular to longitudinal axis 36) along inner block axis 56. Inner block axis 56 may be substantially perpendicular (e.g., perpendicular or nearly perpendicular) to longitudinal axis 36 while resonator is in a resting state.

In some examples, inner block 40a may be rectangular in shape defining a width and length (e.g., as measured in the x-axis and y-axis directions of FIG. 3 respectively) of any suitable size. In some examples, the relative length of inner block 40a (e.g., as measured in the y-axis of FIG. 3) may be on the order of about ⅓ to about ½ the size of the relative width of inner block 40a (e.g., as measured in the y-axis of FIG. 3). Additionally, or alternatively, the relative length of inner block 40a may be greater than the relative width of a respective elongated tine 34a (e.g., as measured in the x-axis of FIG. 3) and less than about five times the relative width of a respective elongated tine 34a. In some examples, inner block 40a and outer block 42a may be substantially the same (e.g., the same or nearly the same) size, while in other examples, inner block 40a and outer block 42a may be different sizes. For example, the relative width outer block 42a may be less than the relative width of inner block 40a.

Elongated tines 34a and 34b may each extent parallel to longitudinal axis 36 from second end 52b of inner block 40a to a respective second end of inner block 40b. Central axes 58 of elongated tines 34a and 34b may be separated by a separation distance (e.g., the distance W2 between the central axes 58 of elongated tines 34a and 34b) as measured perpendicular to longitudinal axis 36 with the elongated tines 34a and 34b bisecting the center line (e.g., longitudinal axis 36) of resonator 30. In some examples, the separation distance (e.g., distance W2) between elongated tines 34a and 34b may be greater than the separation distance (e.g., distance W1) between pair of interconnect members 44a for reasons discussed further below with respect to FIG. 4 or, in some examples, may be equal to or less than the separation distance (e.g., distance W1. In some examples, the relative separation distance (e.g., distance W2) may be on the order of less than about ⅕ the total length of elongated tines 34a and 34b and may be greater than about twice the width of a respective elongated tine 34a.

The vibrational drive and sense functions of resonator 30 may be achieved in a variety of ways including for example, using electrostatic combs drive element, variable gap parallel plate capacitor drive element, piezoelectric drive element, or the like. When using electrostatic combs, as well as other drive and sense mechanisms, elongated tines 34a and 34b often need to separate by a sufficient distance (e.g., a separation distance (e.g., distance W2) of at least between about five to about ten times the width of a respective elongated tine 34a) to accommodate the placement of the sense and/or drive elements (e.g., electrostatic combs 76 shown in FIG. 5) between elongated tines 34a and 34b. While having a larger separation distance (e.g., distance W2) between elongated tines 34a and 34b may be useful in avoiding some of the undesirable vibration modes that can occur when elongated tines 34a and 34b are closely spaced and a truss system is used to connect the drive and sense features, placing elongated tines 34a and 34b at a larger separation distance W2 from one another may lead to certain inaccuracies such as increased longitudinal strain on mounting pads 32a and 32b. One such longitudinal strain is referred to as "end-pumping." End-pumping occurs as a result of the longitudinal strain (e.g., in the direction of longitudinal axis 36) exerted on mounting pads 32a and 32b and pad connectors 46a and 46b caused by the opposing bending moments from elongated tines 34a and 34b. For example, as elongated tines 34a and 34b bow outward, restraining moments may be generated at the ends of the elongated tines 34a and 34b on surface 52b of inner block 40a. These moments will cause inner block 40a to bend as shown in FIG. 4, which in turn can cause a pulling force on pad connector 46a and mounting pad 32a.

As the elongated tines 34a and 34b vibrate between the flexed and null positions, the pulling force on mounting pads 32a and 32b will oscillate creating the pumping effect. End-pumping may lead to cross coupling between elongated tines 34a and 34b, which deteriorates accuracy of the accelerometer.

The inclusion of isolation mechanisms 38a and 38b may help reduce the effect of end-pumping by providing better system balancing of the strains between elongated tines 34a and 34b and mounting pads 32a and 32b. FIG. 4 is an enlarged schematic view of isolation mechanism 38a of resonator 30 of FIG. 2 while in a resonance state. As shown in FIG. 4, both elongated tines 34a and 34b are resonating and shown at the at the time during their oscillation when the two tines are flexing away from each other in the x-axis direction of FIG. 3 increasing the separation distance between the tines. This movement causes inner block 40a to deflect along inner block axis 56 in the negative y-axis direction (e.g., bow away from mounting pad 32a). Absent the presence of isolation mechanism 38a, the deflection of inner block 40a would transfer to pad connector 46a to pull mounting pad 32a in the negative y-axis direction creating additional longitudinal strain unassociated with the deflection of the proof mass.

Isolation mechanism 38a generates a balancing strain by creating an opposing deflection in outer block 42a via interconnect members 44a and 44b to establish an opposite pushing force on pad connector 46a. For example, as inner block 40a deflects or bows along inner block axis 56 in the negative y-axis direction, interconnect members 44a and 44b will be forced closer together and rotate. The displacement and rotation of interconnect members 44a and 44b will in turn force a deflection in outer block 42a, causing outer block 42a to deflect or bow along outer block axis 50 in the positive y-axis direction. The opposing deflections of inner block 40a and outer block 42a may counter balance one another to reduce or eliminate the resultant end-pumping effect on pad connector 46a and mounting pad 32a by adjusting the distance W1 between interconnect members 44a and 44b relative to the distance between the tines W2. In some examples, the amount of deflection observed in inner block 40a and outer block 42a may be different or non-symmetrical. In some examples, the relative size, positioning, and placement of the various components of isolation mechanisms 38a and 38b may be selected using geometric modeling (e.g., using finite-element analysis software such as ANSYS or ABAQUS).

Figure 5:
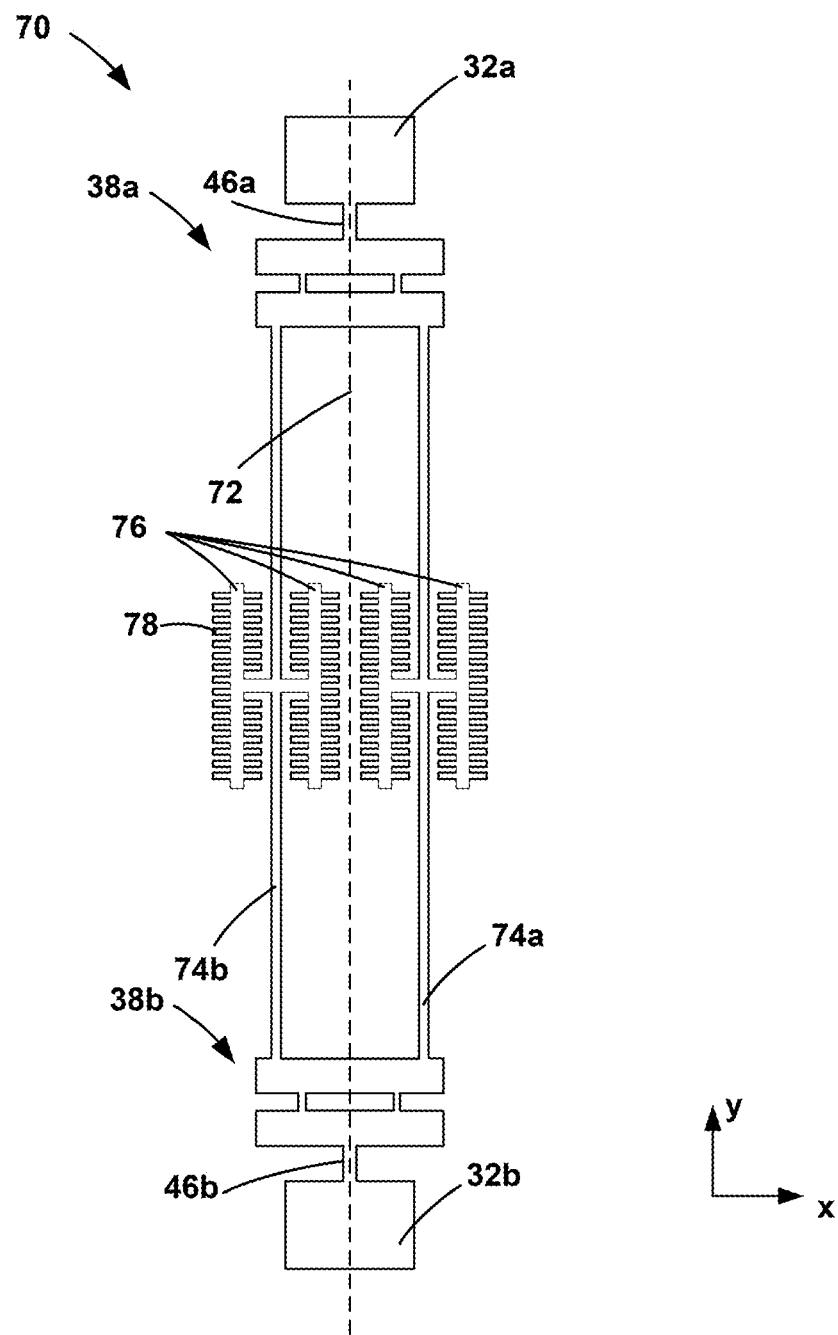
FIG. 5 is an enlarged schematic view of another example resonator that that may be used with the proof mass assembly of FIG. 1A.

FIG. 5 is an enlarged schematic view of another example resonator 70 (e.g., one of resonators 20a and 20b) that includes a first and a second mounting pad 32a and 32b positioned at opposite ends of resonator 70. Resonator 70 also includes a set of elongated tines 74a and 74b that extend parallel to each other along a longitudinal axis 72 or resonator 70. Positioned between elongated tines 74a and 74b and the respective first and second mounting pads 32a and 32b are isolation mechanisms 38a and 38b, each having one end connected to elongated tines 74a and 74b and an opposite end connected first and second mounting pads 32a and 32b by pad connectors 46a and 46b. Isolation mechanisms 38a and 38b, first and second mounting pads 32a and 32b, and pad connectors 46a and 46b may be substantially the same (e.g., the same or nearly the same) as the corresponding component described above with respect to resonator 30 apart from any difference noted below.

As shown in FIG. 5, each tine of elongated tines 74a and 74b may include a one or more drive elements 76 in the form of electrostatic combs. In other examples, other drive elements may also be used such as variable gap parallel plate capacitor drive element, piezoelectric drive element, or the like. Electrostatic comb drive elements 76 may be used to drive and provide vibrational motion to elongated tines 74a and 74b. In some examples, a proof mass to which resonator 70 is attached (e.g., proof mass 12) may include a number of drive elements (not shown) that can be used to electrostatically move electrostatic comb drive elements 76. In certain designs, for example, the drive elements can include a number of interdigitated fixed or anchored comb fingers (not shown) that are interspaced within a corresponding plurality of comb fingers 78 attached to electrostatic comb drive elements 76. Spacing between the fixed or anchored comb fingers and comb fingers 78 is a relatively small gap (e.g. about 1 μm to about 2 μm). During operation, an electrical charge can be applied to the comb fingers to induce an electrostatic charge between the interleaved comb fingers that will generate a pull in force to increase the relative engagement or overlap between the interleaved comb fingers, converting the electrical energy into mechanical energy, thereby providing a drive method for causing elongated tines 74a and 74b to transversely vibrate.

In other examples, each tine of elongated tines 74a and 74b may include electrostatic comb drive elements other than those depicted in FIG. 5. For example, in some examples each tine of elongated tines 74a and 74b may include a plurality of comb fingers 78 that extend transversely out from one or both sides of a respective elongated tine 74a or 74b. In other examples, each tine of elongated tines 74a and 74b may include drive mechanisms other than electrostatic comb drive elements.

Various examples have been described. These and other examples are within the scope of the following claims.

What is claimed is:

1. A resonator defining a longitudinal axis, the resonator comprising:
   a mounting pad;
   a pad connector;
   an isolation mechanism comprising:
      an outer block defining a first outer end and a second outer end;
      an inner block defining a first inner end and a second inner end; and
      a pair of interconnect members, wherein each respective interconnect member of the pair of interconnect members connects the second outer end to the first inner end;
   a pair of elongated beams extending in the direction of the longitudinal axis, wherein respective first ends of the pair of elongated beams are connected to the second inner end, wherein the pad connector connects the mounting pad to the first outer end, wherein the pair of interconnect members are separated by a first distance as measured perpendicular to the longitudinal axis, wherein the pair of elongated beams are separated by a second distance as measured perpendicular to the longitudinal axis, and wherein the first distance is less than the second distance, causing the inner block and the outer block to flex in opposite directions responsive to the flex in the pair of elongated beams during a vibration of the pair of elongated beams, and causing the pair of interconnect members to flex in opposite directions responsive to the flex in the pair of elongated beams during the vibration of the pair of elongated beams;
   a first set of comb fingers which extend outward from a first elongated beam of the pair of elongated beams; and
   a second set of comb fingers which extend outward from a second elongated beam of the pair of elongated beams,
   wherein the first set of comb fingers and the second set of comb fingers cause the pair of elongated beams to vibrate in response to receiving an electrostatic charge.

2. The resonator of claim 1,
   wherein the inner block is configured to flex in a first direction relative to an axis perpendicular to the longitudinal axis,
   wherein the outer block is configured to flex in a second direction relative to an axis perpendicular to the longitudinal axis, and
   wherein the second direction relative to the axis perpendicular to the longitudinal axis is opposite the first direction relative to the axis perpendicular to the longitudinal axis.

3. The resonator of claim 1,
   wherein the pair of elongated beams comprise a first elongated beam and a second elongated beam,
   wherein the first elongated beam is configured to flex in a first direction relative to the longitudinal axis,
   wherein the second elongated beam is configured to flex in a second direction relative to the longitudinal axis, and
   wherein the second direction relative to the longitudinal axis is opposite the first direction relative to the longitudinal axis.

4. The resonator of claim 1, wherein the pair of elongated beams are separated such that a center line of the resonator bisects the pair of elongated beams.

5. The resonator of claim 4, wherein the pair of interconnect members are separated such that the center line of the resonator bisects the pair of interconnect members.

6. The resonator of claim 5, wherein the pad connector is centered on the center line of the resonator.

7. The resonator of claim 1, wherein the first set of comb fingers and the second set of comb fingers represent drive elements.

8. A proof mass assembly comprising:
   a resonator defining a longitudinal axis, the resonator comprising:
      a first mounting pad;
      a pad connector;
      an isolation mechanism comprising:
         an outer block defining a first outer end and a second outer end;
         an inner block defining a first inner end and a second inner end; and
         a pair of interconnect members, wherein each respective interconnect member of the pair of interconnect members connects the second outer end to the first inner end; and
      a pair of elongated beams extending in a direction of a longitudinal axis of the first resonator, wherein respective first ends of the pair of elongated beams are connected to the second inner end, and wherein the pad connector connects the first mounting pad to the first outer end, wherein the pair of interconnect members are separated by a first distance as measured perpendicular to the longitudinal axis, wherein the pair of elongated beams are separated by a second distance as measured perpendicular to the longitudinal axis, and wherein the first distance is less than the second distance, causing the inner block and the outer block to flex in opposite directions responsive to a flex in the pair of elongated beams during a vibration of the pair of elongated beams, and causing the pair of interconnect members to flex in opposite directions responsive to the flex in the pair of elongated beams during the vibration of the pair of elongated beams;

a first set of comb fingers which extend outward from a first elongated beam of the pair of elongated beams; and a second set of comb fingers which extend outward from a first second elongated beam of the pair of elongated beams, wherein the first set of comb fingers and the second set of comb fingers cause the pair of elongated beams to vibrate in response to receiving an electrostatic charge;

a proof mass;

a proof support; and at least one flexure connecting the proof mass to the proof support, wherein the first mounting pad of the resonator is bonded to a surface of either the proof mass or a surface of the proof support.

9. The proof mass assembly of claim 8, wherein the inner block is configured to flex in a first direction relative to an axis perpendicular to the longitudinal axis, wherein the outer block is configured to flex in a second direction relative to an axis perpendicular to the longitudinal axis, and wherein the second direction relative to the axis perpendicular to the longitudinal axis is opposite the first direction relative to the axis perpendicular to the longitudinal axis.

10. The proof mass assembly of claim 8, wherein the pair of elongated beams comprise a first elongated beam and a second elongated beam, wherein the first elongated beam is configured to flex in a first direction relative to the longitudinal axis, wherein the second elongated beam is configured to flex in a second direction relative to the longitudinal axis, and wherein the second direction relative to the longitudinal axis is opposite the first direction relative to the longitudinal axis.

11. The proof mass assembly of claim 8, wherein the pair of elongated beams are separated such that a center line of the resonator bisects the pair of elongated beams.

12. The proof mass assembly of claim 11, wherein the pair of interconnect members are separated such that the center line of the resonator bisects the pair of interconnect members.

13. The proof mass assembly of claim 12, wherein the pad connector is centered on the center line of the resonator.

14. The proof mass assembly of claim 8, wherein the first set of comb fingers and the second set of comb fingers represent drive elements.

15. A resonator defining a longitudinal axis, the resonator comprising:

a first mounting pad and a second mounting pad;

a first pad connector and a second pad connector;

a first isolation mechanism and a second isolation mechanism, wherein each isolation mechanism of the first isolation mechanism and the second isolation mechanism comprises:

an outer block defining a first outer end and a second outer end;

an inner block defining a first inner end and a second inner end; and a pair of interconnect members, wherein each respective interconnect member of the pair of interconnect members connects the second outer end to the first inner end; and a pair of elongated beams extending in the direction of the longitudinal axis, wherein respective first ends of the pair of elongated beams are connected to the second inner end of the first isolation mechanism and respective second ends of the pair of elongated beams are connected to the second inner end of the second isolation mechanism, wherein the pair of interconnect members are separated by a first distance as measured perpendicular to the longitudinal axis, wherein the pair of elongated beams are separated by a second distance as measured perpendicular to the longitudinal axis, and wherein the first distance is less than the second distance, causing the inner block and the outer block to flex in opposite directions responsive to a flex in the pair of elongated beams during a vibration of the pair of elongated beams, and causing the pair of interconnect members to flex in opposite directions responsive to the flex in the pair of elongated beams during the vibration of the pair of elongated beams;

a first set of comb fingers which extend outward from a first elongated beam of the pair of elongated beams; and a second set of comb fingers which extend outward from a first second elongated beam of the pair of elongated beams, wherein the first set of comb fingers and the second set of comb fingers cause the pair of elongated beams to vibrate in response to receiving an electrostatic charge, wherein the first pad connector connects the first mounting pad to the first outer end of the first isolation mechanism, and wherein the second pad connector connects the second mounting pad to the first outer end of the second isolation mechanism.

16. The resonator of claim 15, wherein the pair of elongated beams are separated such that a center line of the resonator bisects the pair of elongated beams.

17. The resonator of claim 16, wherein the pair of interconnect members of at least the first isolation mechanism is separated such that a center line of the resonator bisects the pair of interconnect members.

18. The resonator of claim 17, wherein at least the first pad connector is centered on the center line of the resonator.

19. The resonator of claim 15, wherein the first set of comb fingers and the second set of comb fingers represent drive elements.

20. The resonator of claim 15, wherein the inner block is configured to flex in a first direction relative to an axis perpendicular to the longitudinal axis, wherein the outer block is configured to flex in a second direction relative to an axis perpendicular to the longitudinal axis, and wherein the second direction relative to the axis perpendicular to the longitudinal axis is opposite the first direction relative to the axis perpendicular to the longitudinal axis.

\* \* \* \* \*